United States Patent [19]

Georges et al.

[11] Patent Number: 6,157,810
[45] Date of Patent: Dec. 5, 2000

[54] DISTRIBUTION OF RADIO-FREQUENCY SIGNALS THROUGH LOW BANDWIDTH INFRASTRUCTURES

[75] Inventors: John B. Georges, Berkeley; David M. Cutrer, Walnut Creek, both of Calif.

[73] Assignee: LGC Wireless, Inc, San Jose, Calif.

[21] Appl. No.: 09/095,084

[22] Filed: Jun. 9, 1998

Related U.S. Application Data

[63] Continuation-in-part of application No. 08/841,941, Apr. 8, 1997, Pat. No. 5,983,070, which is a continuation-in-part of application No. 08/635,368, Apr. 19, 1996, abandoned.

[51] Int. Cl.[7] .................................................. H04B 7/15
[52] U.S. Cl. ......................... 455/11.1; 455/3.1; 455/209
[58] Field of Search ............................ 455/3.1, 14, 16, 455/20, 22, 63, 208, 209, 316, 317, 318, 319, 11.1, 12.1

[56] References Cited

U.S. PATENT DOCUMENTS

| | | | |
|---|---|---|---|
| 4,972,346 | 11/1990 | Kawano et al. | 455/9 |
| 5,765,099 | 6/1998 | Georges et al. | 455/14 |
| 5,774,789 | 6/1998 | Van der Kaay et al. | 455/16 |
| 5,983,070 | 11/1999 | Georges et al. | 455/3.1 |

FOREIGN PATENT DOCUMENTS

| | | |
|---|---|---|
| 0442259 | 8/1991 | European Pat. Off. . |
| 2282298 | 3/1995 | United Kingdom . |

*Primary Examiner*—Daniel S. Hunter
*Assistant Examiner*—C. Chow
*Attorney, Agent, or Firm*—Luman Intellectual Property Services

[57] ABSTRACT

A system and method for transmitting a radio frequency (RF) signal in a RF bandwidth over a low bandwidth medium, e.g., in-building cabling, which has a transmission bandwidth below the RF bandwidth. The system has a unit for intercepting the RF signal and a global reference oscillator for distributing a global reference tone of high stability to the entire system. Local oscillators are controlled by adjustment signals derived from this global reference tone to deliver RF reference tones of high stability required for mixing the RF signal to obtain an intermediate frequency (IF) signal which is fed through the low bandwidth medium. The global reference tone is preferably delivered through the same low bandwidth medium to desired locations, such as remote coverage sites in a network for cellular communications, cordless telephony, local RF communications, interactive multi-media video, high bit-rate local communications. A modified RF signal is generated at the desired location by mixing the IF signal and a local reference signal controlled by the global reference signal.

6 Claims, 6 Drawing Sheets

DISTRIBUTION OF RADIO-FREQUENCY SIGNALS THROUGH LOW BANDWIDTH INFRASTRUCTURES

RELATED APPLICATIONS

This application is a continuation-in-part of the Ser. No. 08/841,941 filed Apr. 8, 1997 is now U.S. Pat. No. 5,983,070, which is a continuation-in-part of application No. 08/635,368, Apr. 19, 1996, abandoned.

BACKGROUND

1. Field of the Invention

The present invention relates to the field of radio-frequency (RF) signal distribution, and in particular to an apparatus and method for distributing RF signals through low bandwidth infrastructures.

2. Description of Prior Art

The demand for wireless communications continues to grow rapidly. The need for efficient and low-cost systems for distributing radio frequency (RF) signals is a direct consequence of this growth. Distribution of RF signals is particularly difficult in areas with many natural and man-made obstacles which scatter or absorb RF radiation. For example, the problem of RF distribution is especially acute inside and around building structures.

Current in-building distribution systems consist of two major parts. The first is a set of antennas and associated accessories required for re-transmitting the RF signals inside buildings. The second is a cabling system, e.g., an optical fiber network, used for interconnecting the in-building antennas with a main antenna. The latter is usually installed on top of the building or at some location where the external RF signals can be easily intercepted. In cases where the RF signals are supplied via a high transmission bandwidth cable the main antenna can be replaced by a direct interface with the RF network, e.g., in the basement.

The most effective manner of distributing RF signals inside or around buildings is to use an existing or standard in-building cable infrastructure. Unfortunately, several obstacles prevent this approach. The major problem is related to the frequency bands used for transmitting RF information signals. Cellular communications presently utilize a carrier frequency around 1 GHz. For, example, the AMPS protocol uses the bandwidth from 824–894 MHz and GSM is transmitted between 890–960 MHz. Recent legislation has allowed PCS services to move to even higher frequencies (e.g., 1,850–1,990 MHz). In comparison, the standard in-building cabling such as unshielded or shielded twisted pair (UTP and STP) used for local area networks (LAN), telephone cables, multi-mode optical fiber links, and power lines are limited to much lower transmission bandwidths. For example, category 5 (10 base T) UTP cable has signal loss and cross talk properties that limit the bandwidth to approximately 0–100 MHz for distances <100 m. Although these parameters suffice for LAN applications, they are clearly inadequate for the delivery of PCS signals to and from remote antenna sites.

In the related patent application (patent application No. 08/871556), we disclosed a novel system and a method for transmitting a radio frequency (RF) signal in an RF bandwidth over a low bandwidth medium, e.g., in-building cabling, which has a transmission bandwidth below the RF bandwidth. The original RF signal is recovered at the desired location by using this invented system and method. This system and method is both cost effective and reliable.

Additional issue arises when certain PCS service, such as a cellular communication service, is required to be limited to a desired location. One example of such situation is: An employer gives employees cellular telephones to be used at a work site. Another example of such situation is: A shopping mall lends customers cellular telephones to be used during shopping. In these situations, it becomes a desired feature of the cellular telephones to be operable only within the designated locations, such as the work site or the shopping mall. Such issue is not resolved in the systems or the methods provided in the prior art or the related patent.

OBJECTS AND ADVANTAGES OF THE INVENTION

An objective of the present invention is to provide a system and method for distributing RF signals through low bandwidth infrastructure. In particular, it is an object of the invention is to enable one to modify the transmitted and received frequency band of the distributed RF signals at desired locations.

Another objective of the invention is to provide an RF signal distribution system which eliminates signal oscillation and improves the quality of distributed RF signals.

It is yet another objective of the invention is to provide an RF signal distribution system which has the ability of frequency planning.

Still another objective of the invention is to provide a system and method which confines the use of transmitters or receivers operating within a pre-set bandwidth, e.g. a cellular telephone, to the desired locations.

These objectives and advantages will become more apparent after consideration of the ensuing description and the accompanying drawings.

SUMMARY OF THE INVENTION

The objectives of the invention are achieved by a unique system for transmitting a radio frequency (RF) signal in a RF bandwidth over a low bandwidth medium which has a transmission bandwidth below the RF bandwidth. Typically, the low bandwidth medium is a standard cable belonging to common in-building infrastructure. The RF bandwidth is usually selected from the group of RF bandwidths used for cellular communications, cordless telephony, local RF communications, satellite television, interactive multimedia video, high bit-rate local area networks and the like. In these situations the RF bandwidth is narrower than the transmission bandwidth of the low bandwidth medium. The latter can be a category 5 UTP cable, a telephone wire, a fiber-optic cable, an unshielded cable, a power cable or any other low bandwidth, standard in-building infrastructure.

The system has a unit, usually a main antenna or base station, for intercepting the RF signal. A global reference oscillator, preferably a very high stability oscillator such as a temperature-stabilized crystal oscillator, provides a global reference tone of high stability, e.g., <1 part per million stability, at a frequency within the transmission bandwidth of the low bandwidth medium. In the preferred embodiment the global reference oscillator is located in a safe location inside a distribution hub and the global reference tone is delivered from there to the entire system.

A first local oscillator, preferably a voltage-controlled oscillator (VCO),. is controlled by a first adjustment signal derived from the global reference tone. With the aid of the first adjustment signal the first local oscillator generates a first RF reference tone of high stability. The main antenna and the first local oscillator are connected to a first mixer, such that the first RF reference tone and the RF signal are delivered to this first mixer. From these two signals the mixer generates an intermediate frequency (IF) signal, which is fed through the low bandwidth medium. The IF signal has a frequency contained within the transmission bandwidth of the low bandwidth medium.

A second local oscillator is provided at a remote location, e.g., in a remote coverage area. The second local oscillator is controlled by a second adjustment signal also derived from the global reference tone. In this manner the second local oscillator generates a second RF reference tone of high stability at a different frequency from the first RF reference tone. A second mixer is also provided at the remote location and connected to the second local oscillator and to the low bandwidth medium. Thus, the second mixer receives the second RF reference and the IF signal. By mixing these two signals the mixer generates a modified RF signal whose bandwidth is selected from the group of RF bandwidths used for cellular communications, cordless telephony, local RF communications, satellite television, interactive multimedia video, high bit-rate local area networks and the like. The modified RF signal has a different frequency from the original RF signal. Of course, this system can be extended to any number of remote locations, as will be necessary in a practical system which provides radio coverage to an entire building structure such as an office building or a shopping center.

When distributing the global reference tone through the low bandwidth medium together with the IF signal it is important that these signals do not overlap. The method of the invention stipulates that this be the case, and, in the preferred embodiment, the global reference tone has a lower frequency than the IF signal. Furthermore, a summing element is provided specifically for the purpose of adding the global reference tone to the IF signal such that both are fed through the low bandwidth medium.

A filter is used for retrieving the global reference tone from the low bandwidth medium at the remote location. This function can be performed by a simple band-pass filter with its window set for the global reference tone. The PLL in this event is located between the filter and the local oscillator at the remote location.

The phase-locking circuit itself consists of a frequency divider, also called a prescaler, connected to the local oscillator for dividing an unstable RF reference tone generated by this oscillator to derive an unstable IF reference tone near the frequency of the global reference tone. Of course, because the local oscillator is unstable, the frequencies will not be matched. A phase comparator is used to lock the unstable IF reference tone to the global reference tone by generating an output adjustment signal proportional to the mismatch between the reference and the IF signals. Preferably, another filter, also called a loop filter, is provided between the output of the phase comparator and the local oscillator. The adjustment signal stabilizes the local oscillator and induces it to generate the second RF reference tone of high stability.

The modified RF signal can be re-transmitted to one or many remote locations, depending on the actual circumstances. Usually, local antennas with overlapping coverage areas will be used for that purpose. The low bandwidth infrastructure can be a network, e.g., a star network, a tree network, a branch network or any other type of network commonly installed inside buildings.

Different modified RF signals at different frequencies can be re-transmitted at different locations by using different frequency up-converting setups. This feature allows the invented system to have frequency planning capability.

In the preferred manner of practicing the invention the frequency of the global reference tone is selected below the bandwidth of the IF signal. Also, the method of the invention teaches bi-directional communications as required in practical applications.

The system according to the present invention completely eliminates the coupling between the re-transmitted RF signals and the primary RF signals because they are at different frequencies. As a consequence, the invented system eliminates signal oscillation due to such coupling and significantly improves the quality of the transmitted RF signals.

The system according to the present invention can be integrated into the frequency up-conversion apparatus used in a base station for wireless communication. As a result, the cost for implementing such a system is greatly reduced.

Further details and the preferred embodiment are described in the specification in reference to the attached drawing figures.

DESCRIPTION

Figure 1:
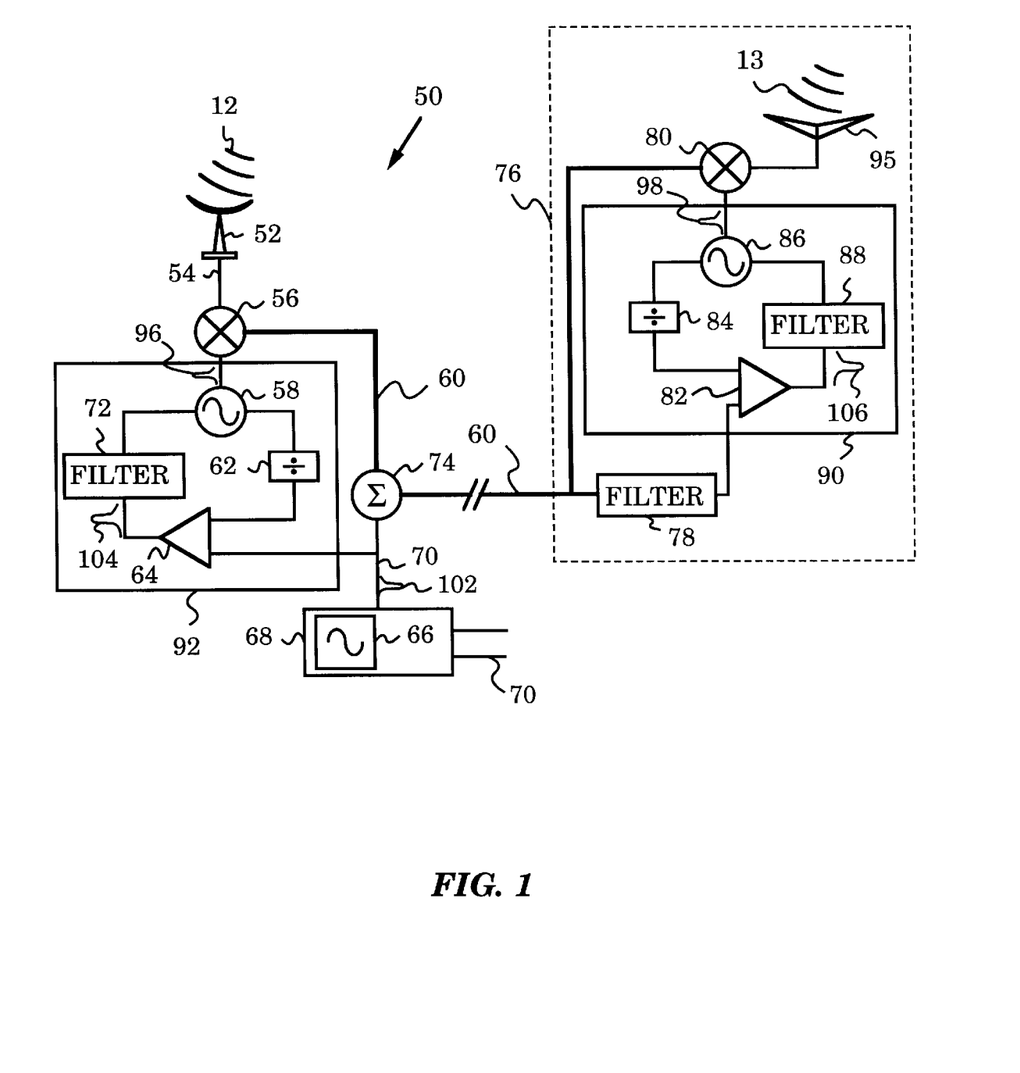
FIG. 1 is a schematic view of a simple RF distribution system according to the invention.

FIG. 1 shows a simple system 50 according to the present invention. System 50 has a main or base antenna 52 which intercepts RF signal 12. Antenna 52 is connected by a communication link 54, e.g., a coaxial cable or any other link capable of transmitting RF signal 12 without undue distortions, to one of the inputs of a first mixer 56. The type of device selected as mixer 56 can include any suitable single ended, balanced, double-balanced, double-double balanced or other mixer. A first local oscillator 58, preferably a voltage-controlled oscillator (VCO), is connected to another input of mixer 56. A low bandwidth medium 60, such as category 5 UTP cable, telephone wire, fiber-optic cable, unshielded or shielded cable, power cable, or any other low bandwidth in-building medium is connected to the output of mixer 56.

Oscillator 58 is typically a low-cost device which by itself produces an unstable RF reference tone. One output of oscillator 58 is connected to mixer 56 and another output leads to a frequency divider 62. The function of divider 62 is fulfilled by any frequency dividing device or circuit capable of dividing the received tone by an integer. The output of divider 62 is further connected to one input of a phase comparator 64. Suitable comparators are well-known in the art.

The second input of comparator 64 is connected to a global reference oscillator 66. As shown, oscillator 66 is housed in a separate housing unit or distribution hub 68. In order to ensure stability and high performance of oscillator 66 hub 68 is installed in an area not exposed to excessive temperature fluctuations, vibrations, or other external influences. These conditions are frequently met inside buildings away from windows, doors, or other openings, e.g., in basements. In addition, the preferred embodiment employs as oscillator 66 a temperature-stabilized crystal oscillator. Devices of this kind can achieve stability figures of about 1 part per million and are commercially available. The frequency of oscillator 66 will be discussed below.

It should be noted, that only one oscillator 66 is used in system 50. Thus, any element of system 50 needs the tone from oscillator 66 can be supplied by it through lines 70. In this case, one of lines 70 connects oscillator 66 to the other input of comparator 64.

The output of comparator 64 is connected to a filter 72. A suitable low-pass loop filter is well-known in the art and can be constructed from commercially available components. The output of filter 72 is connected to the control input of oscillator 58.

In the preferred embodiment system 50 has a summing element or adding device 74 connecting one of lines 70 to low bandwidth medium 60. Device 74 can combine signals already traveling through medium 60 with any additional signal. In this case the signal is produced by oscillator 66. Devices capable of performing this operation are well-known in the art.

At a remote coverage location or site 76 medium 60 is connected to a filter 78 and to a second mixer 80. Filter 78 has a pre-set band-pass for selecting a specific frequency from the signals transmitted through medium 60. The output of filter 78 is connected to one of the inputs of a phase comparator 82. The other input of comparator 82 is connected to the output of a frequency divider 84, similar to frequency divider 62 but operate at a different scaling factor. The scaling factor of divider 84 is determined by the operating frequency of a second local oscillator 86 to which divider 84 is connected. The frequency of this second local oscillator 86 is determined by the preset frequency that is transmitted by antenna 95 in the structure 76. As before, local oscillator 86 is a voltage-controlled oscillator which produces an unstable RF reference tone. The output of comparator 82 is hooked up through a filter 88 to the controlling input of oscillator 86.

Together, oscillator 86, divider 84, comparator 82 and filter 88 form a phase-locking device or circuit 90, frequently also called a phase-locked loop (PLL). In fact, oscillator 58, filter 72, comparator 64 and divider 62 also form a phase-locking circuit 92. Both circuits, 90 and 92, are analogous in construction and operation.

Remote coverage site 76 has a re-transmitting unit 95. In this case an RF antenna for transmitting modified RF signal 13 from mixer 80. The proper position of antenna 95 at site 76 to ensure RF coverage will be determined by the persons installing system 50 on a case by case basis.

Figure 3:
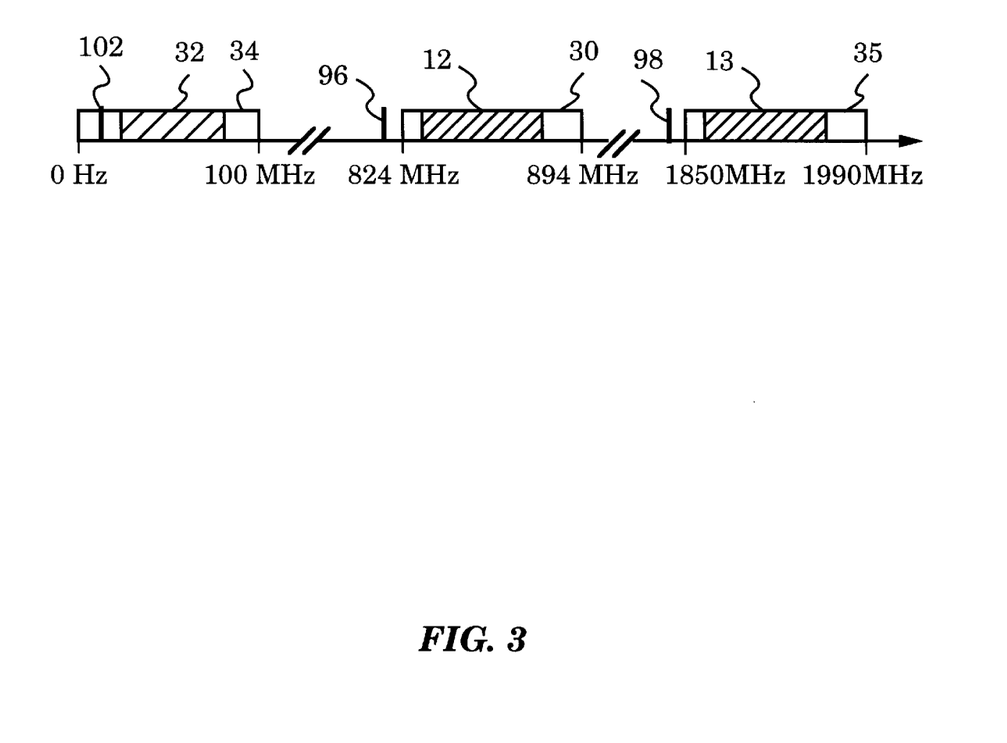
FIG. 3 is a diagram showing an original RF signal within a typical RF bandwidth, a typical transmission bandwidth, and a modified RF signal within another RF bandwidth.

During operation, main antenna 52 of RF distribution system 50 intercepts RF signal 12. As indicated in FIG. 3, RF signal 12 is contained in RF bandwidth 30 ranging from 824 MHz to 894 MHz. In practice, however, RF signal 12 can belong to other RF bandwidths, depending on the type of communication. Thus, RF bandwidth 30 can be selected from the group of RF bandwidths used for cellular communications, cordless telephony, local RF communications, satellite television, interactive multimedia video, high bit-rate local area networks, and the like. The characteristic feature shared by all these RF bandwidths is that they have center frequencies which are higher than transmission bandwidth 34 of medium 60.

Antenna 52 delivers RF signal 12 via communication link 54 to first mixer 56. Meanwhile, phase-locked loop 92 delivers a first RF reference tone 96 (see FIG. 3) of high stability to mixer 56. According to known mixing techniques, first mixer 56 responds to these two inputs by generating an IF signal 32, or, in other words, down-converting RF signal 12. The result of the down-conversion—IF signal 32—is shown in FIG. 3. In the present embodiment, IF signal 32 has a narrower bandwidth (894 MHz–824 MHz=70 MHz) than transmission bandwidth 34 of medium 60. The actual bandwidth of down-converted RF signal 12, i.e., IF signal 32, can vary according to the available in-building infrastructure. At any rate, since the output of first mixer 56 is connected to medium 60, IF signal 32 is transmitted or fed through medium 60.

The down-conversion process itself depends on the stability of first RF reference tone 96 supplied to first mixer 56, and the former usually depends on the stability of first local oscillator 58. In this case, however, the output of oscillator 58 is a first RF reference tone 96 of high stability. This result is achieved with the aid of the phase-locking circuit 92 and global reference oscillator 66.

In the preferred embodiment distribution hub 68 is connected to summing element 74, which interfaces with medium 60. Thus, global reference tone 102 from oscillator 66 is delivered to summing element 74. There, IF signal 32 already traveling through medium 60 is combined with global reference tone 102 and sent through medium 60 to remote coverage site 76. No undesirable interference is created between IF signal 32 and tone 102 result, since their bandwidths do not overlap. In this manner, global reference tone 102 is efficiently forwarded to remote site 76 through the same medium as the useful signal.

At remote site 76 filter 78 retrieves global reference tone 102 from medium 60. Meanwhile, IF signal 32 passes through to second mixer 80. Phase-locking circuit 90 uses tone 102 to stabilize the output of second local oscillator 86. For this purpose comparator 82 produces a second adjustment signal 106 and delivers it through filter 88 to the control input of oscillator 86. The output of oscillator 86 generates stable RF reference tone 98 (FIG. 3). RF tone 98 has a different frequency from reference tone 96. Mixer 80 uses stable RF reference tone 98 to up-convert IF signal 32 and generate modified RF signal 13 with minimal signal distortion. Then, RF antenna 95 receives modified RF signal 13 and re-transmits it throughout site 76.

System 50 can be separated into a down-conversion system, an low bandwidth media 60, and an up-conversion system. The down-conversion system comprises the global oscillator 66, the mixer 56, the phase locking circuit 92 and the summing device 74. The down conversion system comprises the global oscillator 66, the mixer 80, the filter 78 and the phase-locking circuit 90.

System 50 is well-adapted to RF distribution in buildings and other structures using existing low bandwidth media such as conventional cables. The system resources are basic. Only the cost-intensive oscillator, namely global reference oscillator 66, is required to ensure proper up- and down-conversion of signals in this arrangement.

Figure 2:
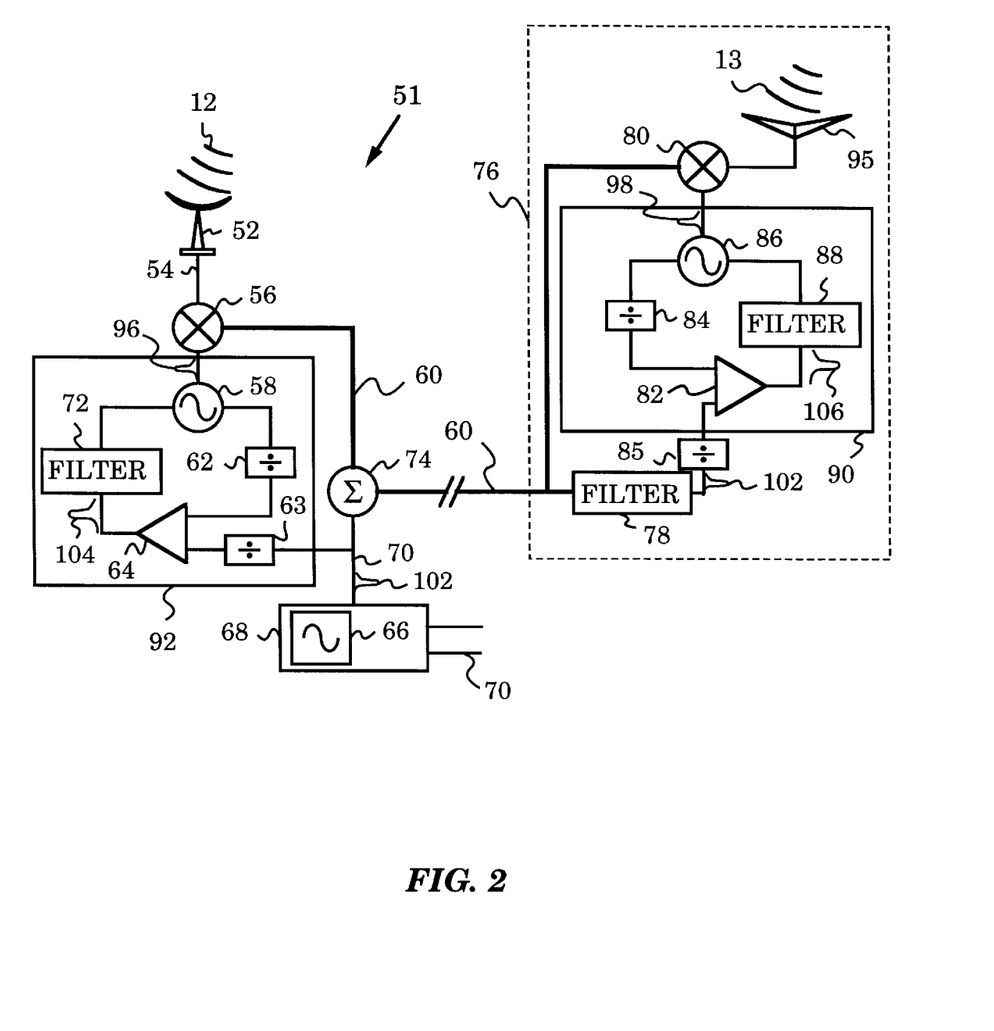
FIG. 2 is a schematic view of another RF distribution system according to the invention.

FIG. 2 illustrates another embodiment of the present invention. A divider 63 is added between the global oscillator 66 and the comparator 64. In a similar manner, a divider 85 is added between filter 78 and a second comparator 82. Divider 63 scales the global oscillation signal 102 by an integer factor before the latter is sent into comparator 64. The scaling factors of dividers 63 and 62 are chosen so that the two input channels of comparator 64 have similar frequencies. Divider 85 also operates on the global oscillator frequency 102. The scaling factors of divider 84 and 85 are selected so that comparator 82 receives similar frequencies to its input. In this particular embodiment, divider 62 and divider 84 have the same scaling factor. Divider 63 and divider 85 have different scaling factors. As a consequence, the first local oscillator 58 and the second local oscillator 86 are locked at different frequencies. As an example, global oscillator 66 generates a signal at 20 MHz. Dividers 62 and 84 both have scaling factor of 100. Divider 63 has a scaling factor of 2, divider 85 has a scaling factor of 1. As a result of this configuration, oscillator 58 is locked at a frequency of 1000 MHz, and oscillator 86 is locked at a frequency of 2000 MHz. Consequently, the transmitted signal 13 is different from the original signal 12.

FIG. 3 better illustrates the relationships of the various signals and their bandwidths in a preferred embodiment. A first RF bandwidth 30 spans the range from 824 MHz to 894 MHz. This range is typical for RF signal 12 used in cellular communications, the down-conversion of RF signal 12 from RF bandwidth 30 yields an IF signal 32 contained in a transmission bandwidth 34. Transmission bandwidth 34 ranges from 0 to 100 MHz, which is typical for low bandwidth media commonly installed in building structures. The modified RF signal 13 is within a second RF band 35 from 1,850 MHz to 1,990 MHz, also typical for cellular communications.

Figure 4:
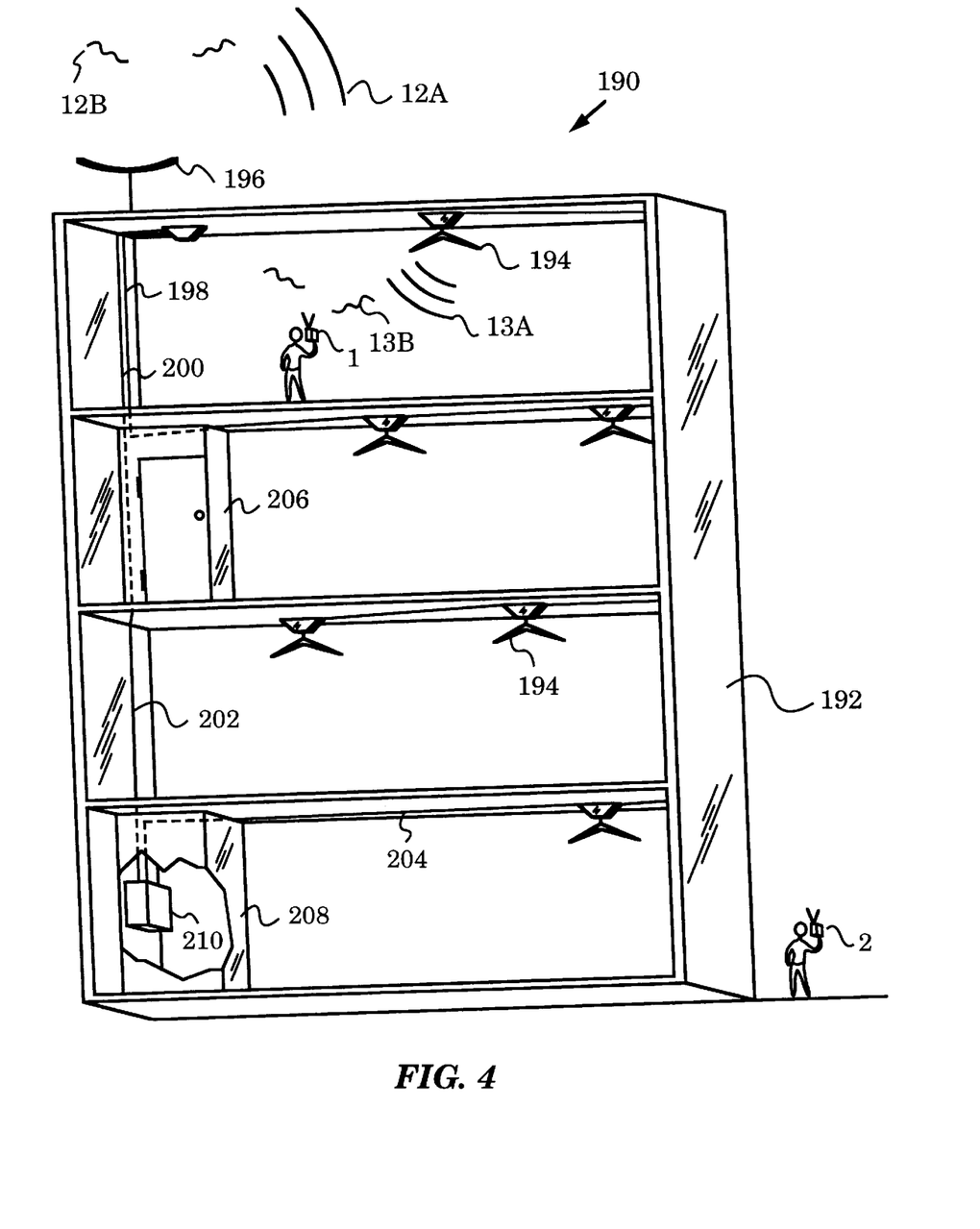
FIG. 4 is a three-dimensional view of the RF distribution system according to the invention adapted to a building structure.

FIG. 4 illustrates an RF distribution system 190 according to the invention used in a building structure 192. In this case system 190 is bi-directional, i.e., RF antennas 194 installed in various locations throughout structure 192 can transmit and receive RF signals 13. For better understanding, transmitted modified RF signals are designated by 13A and received RF signals are indicated by 13B. A main antenna 196 mounted on the roof of structure 192 can transmit and intercept RF signals 12B and 12A respectively.

For example purposes, system 190 is assumed to be used for cellular telephony. Cellular phone 1 and cellular phone 2 are pre-set to receive and transmit modified RF signal 13 in a second RF bandwidth 35. Antennas 194 only covers the space inside of structure 192. That is, signal 13 can not be transmitted or received outside structure 192. Thus, cellular phone 2 does not transmit or receive any signal outside the structure 192, while cellular phone 1 is enabled throughout structure 192 covered by antennas 194. This embodiment is particularly useful in large office complexes and large shopping malls, where cellular phones are issued to employees or customers for usage only within the structure 192. In the former case, the system confines the use of work cellular phones to the working site. In the latter case, the system prevents the customers from taking the cellular phones out of the shopping malls. Cellular phone 1 and cellular phone 2 can also be encoded to receive and transmit both RF signal 12 outside the building 192 and RF signal 13 inside the building 192. The base station can differentiate the RF signals used by cellular phone 1 and cellular phone 2, and bill the customers accordingly. This embodiment can also be useful in a variety of other situations, such as apartment complexes, conference centers, etc.

System 190 utilizes in-building low bandwidth network including cables 198, 200, 202, 204, and wiring closets 206 and 208 to distribute RF signal 12. In this particular arrangement, wiring closet 208 houses a distribution hub 210. The latter supplies global reference tone 102 from a temperature-stabilized crystal oscillator serving as the global reference oscillator (not shown). Protection of hub 210 from external influences is ensured by virtue of location of closet 208 on the ground floor and away from openings such as doors or windows.

Figure 5:
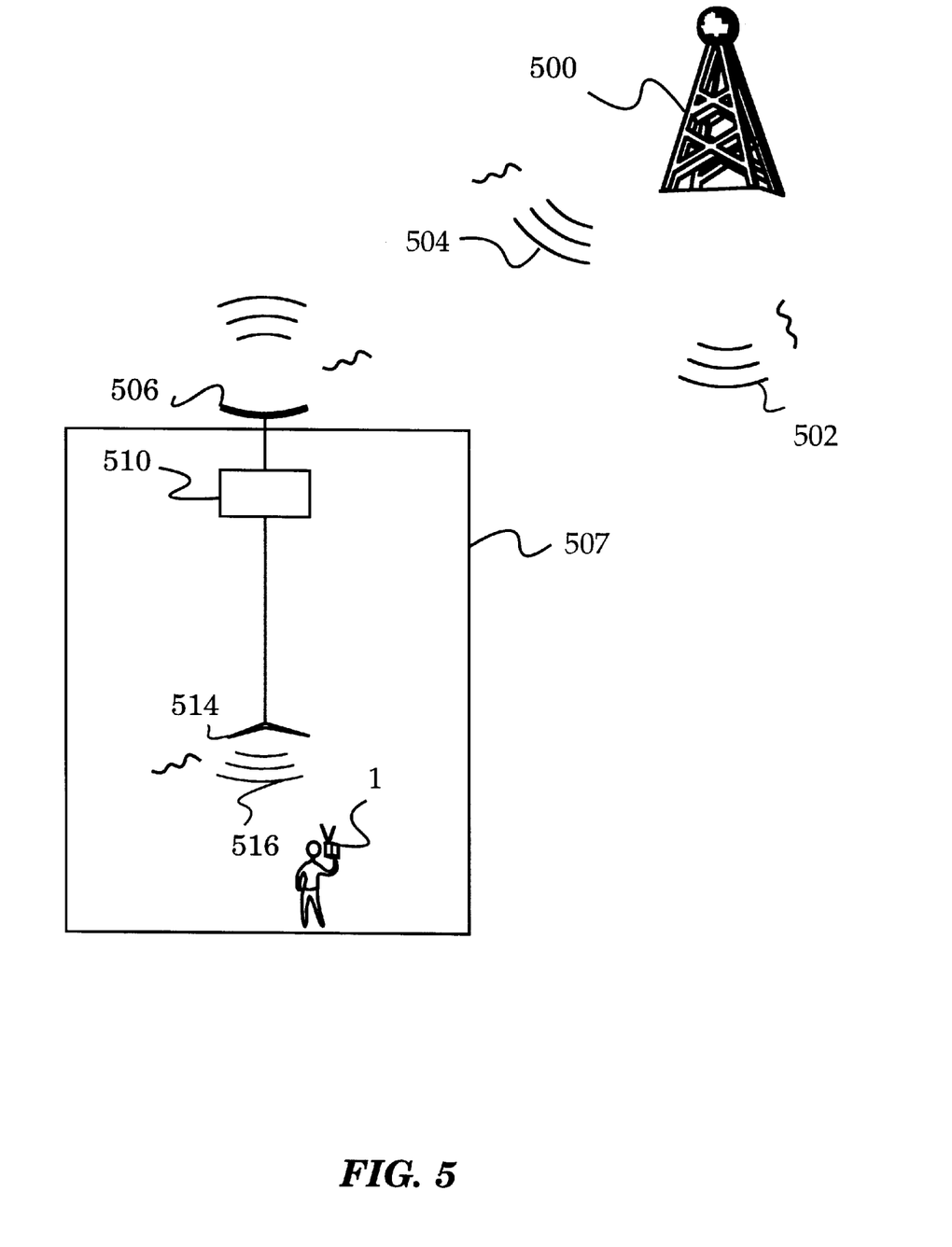
FIG. 5 is a schematic view demonstrating another embodiment of the invention.

FIG. 5 is another embodiment of the present invention. A base station 500 transmits and receives RF signals 504 and 502 in two different channels. Signal 504 is received or transmitted by an antenna 506 of a building 507. The received RF signal 504 is modified and distributed by a system 510. The system 510 corresponds to either the system 50 described in FIG. 1 or the system 51 described in FIG. 2. A modified RF signal 516 is transmitted or received by an antenna 514. The modified RF signal 516 and the RF signals 502 and 504 have different frequency channels. The RF signal 516 is confined inside the building 507, and the RF signal 502 is confined outside the building 507. A cellular phone 1 operates with both the RF signals 516 and 502. So cellular phone 1 works both inside and outside the building 507. The base station 500 can identify the location of the cellular phone 1 by tracking the frequency it is operating at. If the cellular phone 1 is working outside the building 507, the base station 500 will receive and transmit the RF signal 502. If the cellular phone 1 is working inside the building 507, the base station 500 will receive and transmit RF signal 504. Thus, the base station can charge the user of cellular phone 1 according to the locations where the cellular phone 1 is used.

Figure 6:
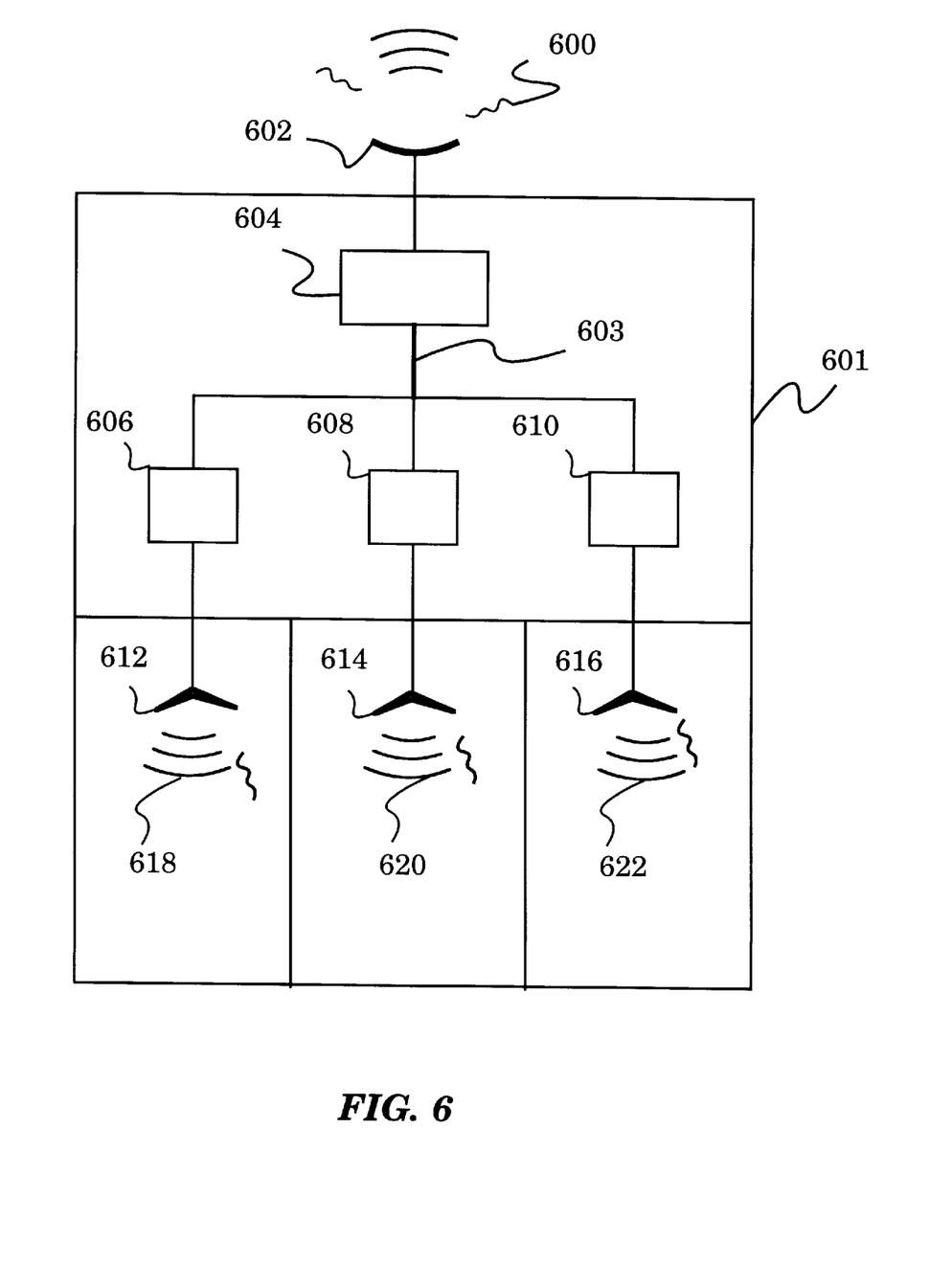
FIG. 6 is a schematic view demonstrating yet another embodiment of the invention.

FIG. 6 shows another embodiment of the present invention. An RF signal 600 is received and transmitted by a main antenna 602 of a building 601. This RF signal 600 is down converted by a down-conversion system 604 to a frequency which can be distributed by an in-building cable system 603. The down-conversion system 604 is described in FIG. 1 and FIG. 2. The down converted signal of the RF signal 602 is up-converted by up-conversion systems 606, 608 and 610 to different modified RF signals 618, 620, and 622, which are transmitted by antennas 612, 614 and 616 correspondingly. The up-conversion systems 606, 608 and 610 are described in FIG. 1 and FIG. 2. The modified RF signals 618, 620 and 622 are at different frequencies, and are covering different locations within the building structure 601. This embodiment demonstrates a method for frequency planning within a building structure. A person of average skill in the art will be able to determine proper frequency allocations based on the cell and base station arrangements and the position of the building 601.

The above embodiments are designed for very simple topologies or environments, and serve mainly to demonstrate the fundamental aspects of the invention. More complicated systems, such as those described in related application (application No. 08/871556) can be adapted to take advantage of the present invention. The versatility of RF distribution systems according to the invention and its numerous embodiments teach a method of distributing RF signals. Indeed, a person skilled in the art will be able to glean from the examples given the characteristic features of the method of the invention.

SUMMARY, RAMIFICATIONS, AND SCOPE

The presented embodiments are only illustrative of some of the many types of networks which can be used according to the invention to distribute RF signals. Every particular network will be different, as conditioned by pre-existing infrastructure. Adaptations to particular bandwidths and frequencies, (e.g., for IF signals) will depend on application.

Therefore, the scope of the invention should be determined, not by examples given, but by the appended claims and their legal equivalents.

We claim:

1. A system for receiving a first RF signal contained in a first RF bandwidth, transmitting said first RF signal over a low bandwidth medium having a transmission bandwidth below said RF bandwidth, and generating a modified RF signal contained in a second RF bandwidth, said system comprising:

a) a receiving means for intercepting said first RF signal;

b) a global reference oscillator for providing said system with a global reference tone of high stability at a frequency within said transmission bandwidth of said low bandwidth medium;

c) a first local oscillator controlled by a first adjustment signal derived from said global reference tone, such that said first local oscillator generates a first RF reference tone of high stability;

d) a first mixing means connected to said receiving means and to said first local oscillator for mixing said first RF reference tone with said RF signal to produce an IF signal within said transmission bandwidth, said first mixing means being further connected to said low bandwidth medium for feeding said IF signal through said low bandwidth medium;

e) a second local oscillator at a remote location from said first local oscillator, said second local oscillator being controlled by a second adjustment signal derived from said global reference tone, such that said second local oscillator generates a second RF reference tone of high stability at a frequency different from said first RF reference tone; and f) a second mixing means connected to said second local oscillator and to said low bandwidth medium for receiving and mixing said IF signal with said second RF reference tone to generate said modified RF signal contained in said second RF bandwidth.

2. The system of claim 1 further comprising a re-transmitting means for re-transmitting said modified RF signal generated by said second mixing means.

3. The system of claim 2 wherein said re-transmitting means comprises a number of RF antennas, said RF antennas having corresponding remote coverage sites.

4. The system of claim 1 wherein said first RF bandwidth and said second RE bandwidth are selected from the group of RE bandwidths used for cellular communications, cordless telephony, local RE communications, satellite television, interactive multi-media video, high bit-rate local area networks.

5. A method for transmitting a RF signal contained in a RF bandwidth over a low bandwidth medium having a transmission bandwidth below said RF bandwidth, said method comprising:

a) intercepting said RF signal;

b) providing said system with a global reference tone of high stability at a frequency within said transmission bandwidth of said low bandwidth medium;

c) generating a first RF reference tone of high stability by using a first adjustment signal derived from said global reference tone to control the output of a first local oscillator, such that said first local oscillator generates said first RF reference tone;

d) mixing said first RF reference tone with said RF signal to produce an IF signal within said transmission bandwidth;

e) feeding said IF signal through said low bandwidth medium;

f) generating a second RF reference tone of high stability by using a second adjustment signal derived from said global reference tone to control the output of a second local oscillator, such that said second local oscillator generates said second RF reference tone; and g) mixing said second RF reference tone with said IF signal fed through said low bandwidth medium to generate a modified RF signal.

6. The method of claim 5 wherein said modified RF signal is intercepted at a remote coverage site and transmitted to a base station through said low bandwidth medium.

* * * * *

UNITED STATES PATENT AND TRADEMARK OFFICE
CERTIFICATE OF CORRECTION

PATENT NO. : 6,157,810
DATED : December 5, 2000
INVENTOR(S) : Georges et al.

It is certified that error appears in the above-identified patent and that said Letters Patent is hereby corrected as shown below:

Title page,
The Attorney, Agent or Firm should read "Lumen Intellectual Property Services" not -Luman Intellectual Property Services-.

Signed and Sealed this

Eighteenth Day of September, 2001

Attest:

NICHOLAS P. GODICI
Attesting Officer    Acting Director of the United States Patent and Trademark Office